United States Patent
Park

(10) Patent No.: US 10,600,996 B2
(45) Date of Patent: Mar. 24, 2020

(54) EMOTION LIGHTING APPARATUS FOR VEHICLE AND METHOD FOR MANUFACTURING THE SAME

(71) Applicant: KOLON GLOTECH, INC., Gwacheon (KR)

(72) Inventor: Byoung Cheul Park, Seosan (KR)

(73) Assignee: KOLON GLOTECH, INC., Gwacheon (KR)

( * ) Notice: Subject to any disclaimer, the term of this patent is extended or adjusted under 35 U.S.C. 154(b) by 94 days.

(21) Appl. No.: 15/452,446

(22) Filed: Mar. 7, 2017

(65) Prior Publication Data

US 2018/0178718 A1 Jun. 28, 2018

(30) Foreign Application Priority Data

Dec. 28, 2016 (KR) .................. 10-2016-0181543

(51) Int. Cl.
*B60Q 3/64* (2017.01)
*F21V 8/00* (2006.01)
(Continued)

(52) U.S. Cl.
CPC ............ *H01L 51/5268* (2013.01); *B60Q 3/64* (2017.02); *B60Q 3/745* (2017.02); *G02B 6/0028* (2013.01); *H01L 51/0097* (2013.01); *H01L 51/5293* (2013.01); *G02B 6/002* (2013.01); *G02B 6/006* (2013.01); *G02B 6/0055* (2013.01); *G02B 6/0095* (2013.01); *H01L 2251/5338* (2013.01);
(Continued)

(58) Field of Classification Search
CPC .. G02B 6/0018; G02B 6/0025; G02B 6/0028; G02B 6/003; G02B 6/002; G02B 6/0015; G02B 6/0016; G02B 6/0023; G02B 6/005; G02B 6/0073; G02B 6/0078; B60Q 3/54; B60Q 3/62; B60Q 3/64
See application file for complete search history.

(56) References Cited

U.S. PATENT DOCUMENTS 3,772,056 A * 11/1973 Polichette ............... C23C 18/26
106/1.26
2001/0022730 A1* 9/2001 Nagata .................... B60Q 3/51
362/490
(Continued)

FOREIGN PATENT DOCUMENTS

JP 2001166296 A * 6/2001
KR 20020042121 A * 6/2002 ............. A63F 13/12
(Continued)

OTHER PUBLICATIONS

Machine translation of KR 2002042121A, retrieved Nov. 13, 2018. (Year: 2018).*
(Continued)

*Primary Examiner* — Anh T Mai
*Assistant Examiner* — Steven Y Horikoshi

(57) ABSTRACT

Disclosed herein is an emotion lighting apparatus for vehicle. According to the present invention, the emotion lighting apparatus for vehicle comprises a lighting unit as a light source selected from the group consisting of OLED and LED, a supporting unit for supporting the light source, and a cover for covering the light unit and including a transmitting window passing light from the light source. In this case, the light unit and cover are bendable.

12 Claims, 7 Drawing Sheets

(51) Int. Cl.
*H01L 51/52* (2006.01)
*H01L 51/00* (2006.01)
*B60Q 3/74* (2017.01)

(52) U.S. Cl.
CPC ..... *H01L 2251/5361* (2013.01); *Y02E 10/549* (2013.01)

(56) References Cited

U.S. PATENT DOCUMENTS

| | | | | |
|---|---|---|---|---|
| 2002/0048165 A1* | 4/2002 | Taniguchi | ............ | G02B 6/0036 362/601 |
| 2005/0213914 A1* | 9/2005 | Fredley | ................ | G02B 6/0055 385/129 |
| 2007/0047246 A1* | 3/2007 | Barowski | ............... | B60Q 1/302 362/488 |
| 2007/0177486 A1* | 8/2007 | Naoi | .................... | G02B 6/0028 369/112.19 |
| 2008/0123367 A1* | 5/2008 | Pan | ...................... | G02B 6/0025 362/628 |
| 2009/0073708 A1* | 3/2009 | Kino | ........................ | B60Q 3/74 362/490 |
| 2009/0303744 A1* | 12/2009 | Iwasaki | ................ | G02B 6/0041 362/612 |
| 2010/0048085 A1* | 2/2010 | Kayanuma | ........... | G02B 6/0018 445/23 |
| 2012/0063154 A1* | 3/2012 | Cannon | ................ | B60R 13/0212 362/490 |
| 2012/0092888 A1* | 4/2012 | Hsieh | ................... | G02B 6/0028 362/606 |
| 2014/0098558 A1* | 4/2014 | Vasylyev | ............. | G02B 6/0036 362/551 |
| 2015/0274066 A1* | 10/2015 | Del Pozo Gonzalez | .................... | B60R 13/02 362/551 |

FOREIGN PATENT DOCUMENTS

| | | |
|---|---|---|
| KR | 10-2009-0040314 A | 4/2009 |
| KR | 101044193 B1 | 6/2011 |
| KR | 101052723 B1 | 7/2011 |
| KR | 1020160103083 A | 8/2016 |

OTHER PUBLICATIONS

Machine translation of JP-2001166296-A, retrieved Nov. 14, 2018 (Year: 2018).*

* cited by examiner

[FIG. 1]
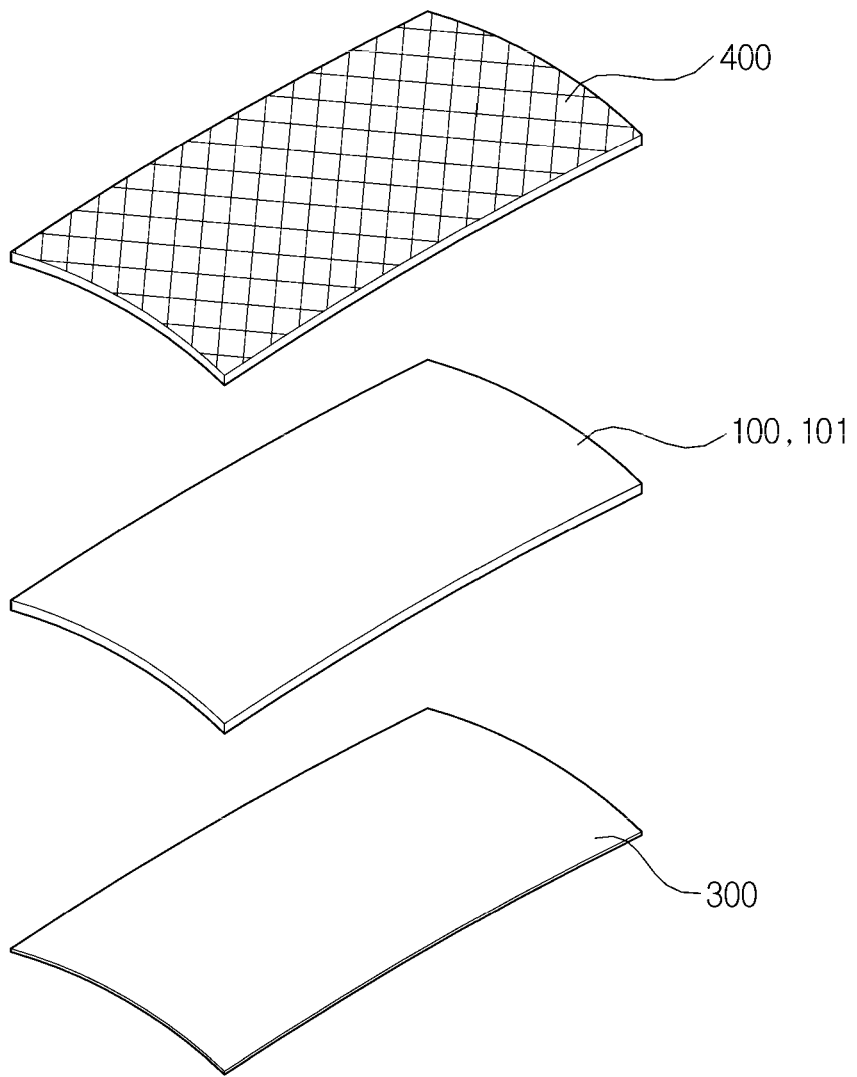

[FIG. 2]
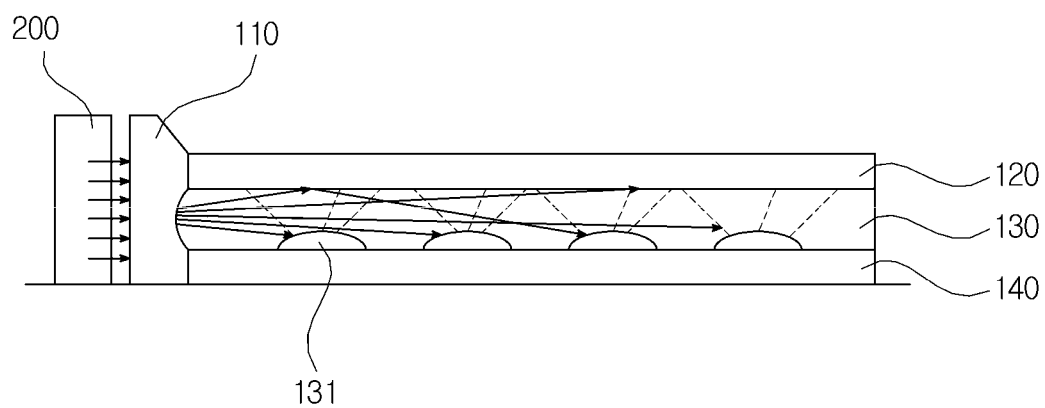

[FIG. 3]
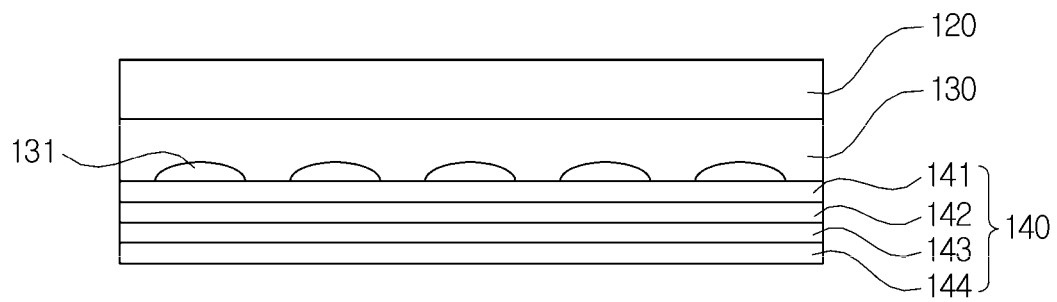

[FIG. 4]
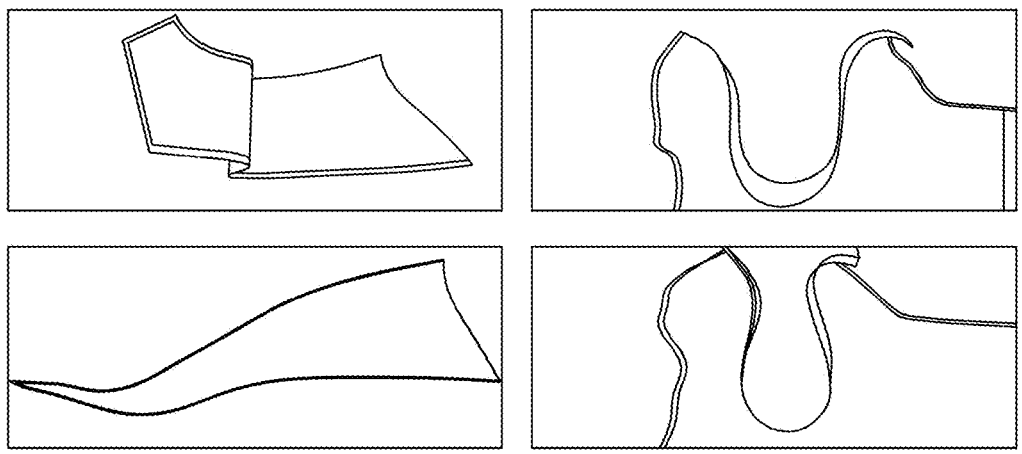

[FIG. 5]
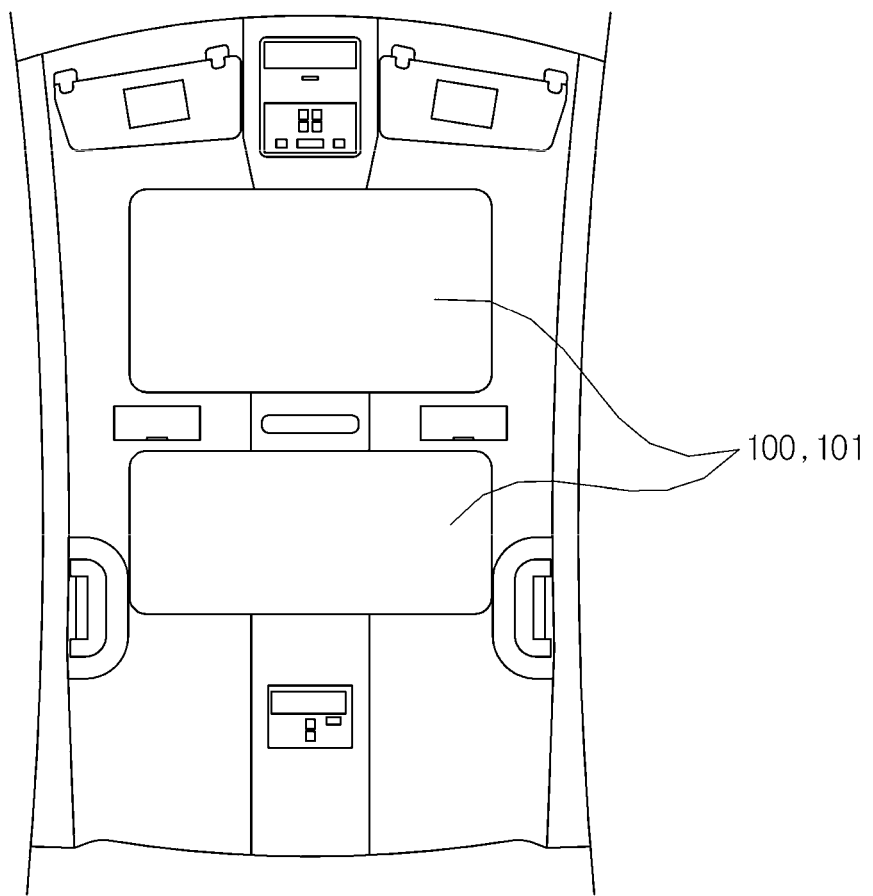

[FIG. 6]
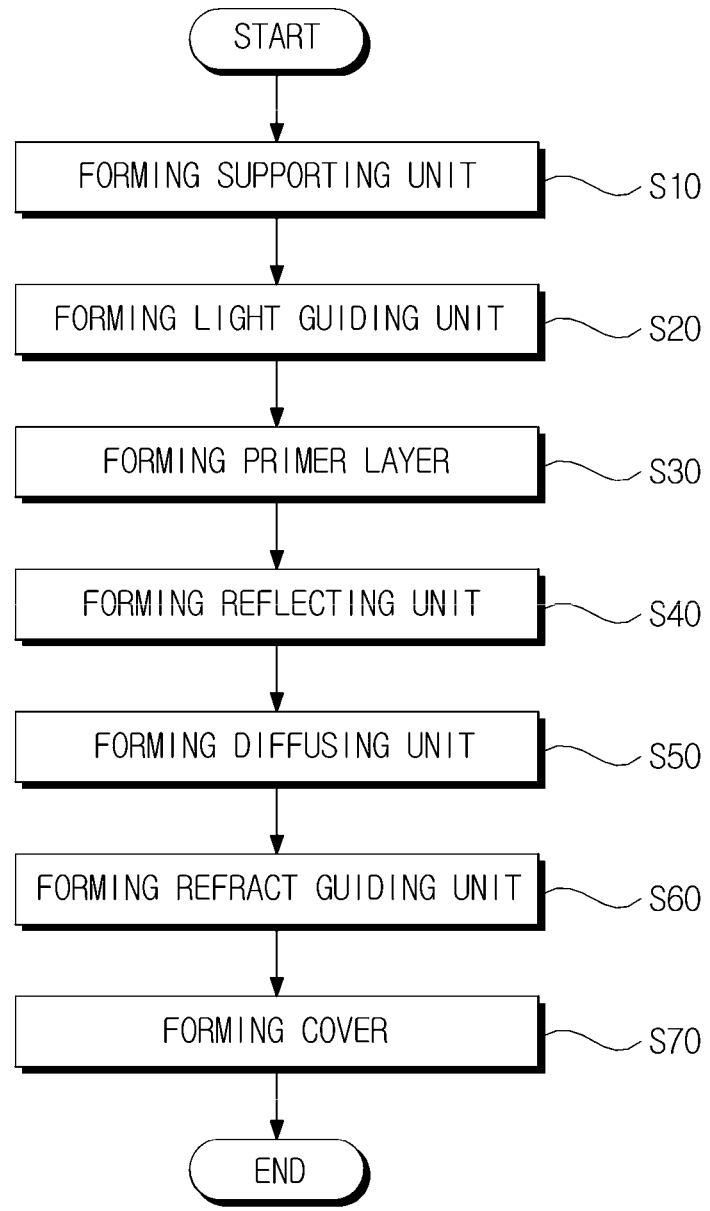

[FIG. 7]
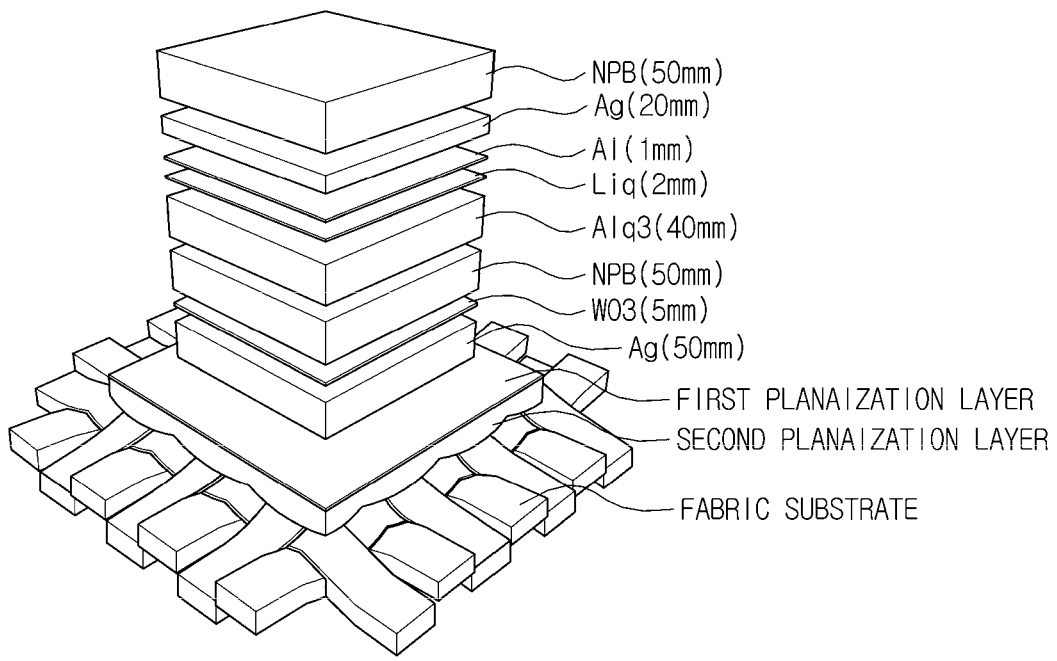

EMOTION LIGHTING APPARATUS FOR VEHICLE AND METHOD FOR MANUFACTURING THE SAME

CROSS-REFERENCE TO RELATED APPLICATIONS

This application claims priority to and the benefit of Korean Patent Application No. 10-2016-0181543 filed in the Korean Intellectual Property Office on Dec. 28, 2016, the entire contents of which are incorporated herein by reference.

TECHNICAL FIELD

The present invention relates to an emotion lighting apparatus for vehicle and a method for manufacturing the same, in particularly, an emotion lighting apparatus for vehicle formed with a backlight unit without additional adhesion layers in one entity and having flexibility by thin thickness and a method for manufacturing the same.

BACKGROUND ART

In general, various lighting apparatus are installed in crash pads, door trims, and the like of clusters for enhancing recognizability of divers when night-driving time.

For example, clusters for providing driving information through characters or figures of vehicles or engines are formed in front of driver's seats. These clusters include dash boards including graduation, character, and guidelines and lighting apparatus for recognizing these information. In order to prevent glaring caused by direct lighting apparatus, indirect lighting apparatus has been embodied between dials and windows.

In addition, speaker embedded mood lamps of vehicle doors include lighting means, which indirectly lights interior of vehicles. Like this, indirect lighting means have been more installed variously in comparison with direct lighting means.

However, these conventional illumination lights have disadvantage of low flexibility of Back Light Unit (BLU) due to PMMA material thereof having 1 mm or more thickness. Also, in the event that illumination units are installed in a large area, it is impossible for them to have flexibility since they should have light sources at four sides.

Therefore, a method all-in-one surface light devices for manufacturing surface lights having high efficiency and a thickness being 1 mm and less is provided.

SUMMARY OF THE INVENTION

One or more exemplary embodiments overcome the above disadvantages and other disadvantages not described above. However, one or more embodiments are not required to overcome the disadvantages described above, and an exemplary embodiment may not overcome any of the problems described above.

One or more embodiments provide a surface lighting apparatus formed without additional adhesion layers in one entity and having thin thickness and a method for manufacturing the same. As a result, it is possible to secure productivity, emit constant light amount from a different angle, and be capable of preventing glaring through flexible surface lighting apparatus.

According to an aspect of one or more embodiments, an emotion lighting apparatus for vehicle comprises a lighting unit using at least one of OLED and LED as a light source, a supporting unit for supporting the light source, and a cover for covering the light unit and including a transmitting window passing light from the light source. In this case, the light unit and cover are bendable.

In an aspect of one or more embodiments, the light source is OLED. The lighting unit further includes a polarizing plate classifying vertical polarizing or horizontal polarizing of light input from the light source to pass or prevent the light.

In an aspect of one or more embodiments, the lighting unit comprises a substrate, a first electrode on the substrate, an organic layer on the first electrode, a second electrode on the organic layer, and a light transparent layer on at least one surface of the second electrode.

In an aspect of one or more embodiments, the lighting unit further includes a backlight unit for dispersing input light and reflecting and scattering at least a part of the dispersed light. The backlight unit further comprises a light guiding unit for dispersing light input from light source through patterns formed in the light guiding unit and a refract guiding unit formed between the light source and the light guiding unit and concentrating total light input by refracting at least a part of light input from the light source to guide the light to the light guiding unit.

In an aspect of one or more embodiments, at least one surface of the refract guiding unit has a slope at a predetermined angle with respect to horizontal plane. The refract guiding unit refracts at least a part of the input light from the light source in a vertical direction using protrusions formed on at least part of an inner surface of the refract guiding unit.

In an aspect of one or more embodiments, one side of the refract guiding unit adjoining the light guiding unit is formed concavely for concentrating the total light input from the light source to guide the light to the light guiding unit.

In an aspect of one or more embodiments, the backlight unit comprises a reflecting unit formed at a lower part of the light guiding unit to reflect light being out among dispersed light of the light guiding unit and a diffusing unit adjoining an upper part of the light guiding unit and scattering light dispersed from the light guiding unit.

In an aspect of one or more embodiments, the reflecting unit further comprises a catalyst layer formed using metallic salts, a silver layer formed using silver injection and reduction liquid on one side of the catalyst layer, and a primer layer for enhancing interfacial adhesion with the catalyst layer.

In an aspect of one or more embodiments, at least a part of the transmitting window is formed of a mesh sheet.

In an aspect of one or more embodiments, the light source and the backlight unit are bar-shaped LED.

According to another aspect of one or more embodiments, a method for manufacturing an emotion lighting apparatus for vehicle comprises, forming a lighting unit as a light source selected from the group consisting of OLED and LED, forming a supporting unit for supporting the light source, and forming a cover for covering the light unit and including a transmitting window passing light from the light source. In this case, the light unit and cover are bendable.

In an aspect of one or more embodiments, the light source is OLED and forming the lighting unit further includes forming a polarizing plate classifying vertical polarizing or horizontal polarizing of light input from the light source to pass or prevent the light.

In an aspect of one or more embodiments, forming the lighting unit comprises forming a substrate, forming a first electrode on the substrate, forming an organic layer on the first electrode, forming a second electrode on the organic layer, and forming a light transparent layer on at least one surface of the second electrode.

In an aspect of one or more embodiments, forming the lighting unit includes forming a backlight unit for dispersing input light and reflecting and scattering at least a part of the dispersed light. Forming the backlight unit further comprises forming a light guiding unit for dispersing light input from light source through patterns formed in the light guiding unit and forming a refract guiding unit formed between the light source and the light guiding unit and concentrating total light input by refracting at least a part of light input from the light source to guide the light to the light guiding unit.

In an aspect of one or more embodiments, in forming the refract guiding unit, at least one surface of the refract guiding unit has a slope at a predetermined angle with respect to horizontal plane. The refract guiding unit refracts at least a part of the input light from the light source in a vertical direction using protrusions formed on at least part of an inner surface of the refract guiding unit.

In an aspect of one or more embodiments, in forming the refract guiding unit, one side of the refract guiding unit adjoining the light guiding unit is formed concavely for concentrating the total light input from the light source to guide the light to the light guiding unit.

In an aspect of one or more embodiments, forming the backlight unit comprises forming a reflecting unit formed at a lower part of the light guiding unit to reflect light being out among dispersed light of the light guiding unit and forming a diffusing unit adjoining an upper part of the light guiding unit and scattering light dispersed from the light guiding unit.

In an aspect of one or more embodiments, forming the reflecting unit further comprises forming a catalyst layer formed using metallic salts, forming a silver layer formed using silver injection and reduction liquid on one side of the catalyst layer and forming a primer layer for enhancing interfacial adhesion with the catalyst layer.

In an aspect of one or more embodiments, at least a part of the transmitting window is formed of a mesh sheet.

In an aspect of one or more embodiments, the light source and the backlight unit are bar-shaped LED.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 1 is a view schematically showing an emotion lighting apparatus for vehicle according to an embodiment of the present invention;

FIG. 2 is a is a view schematically showing a light source and a backlight unit according to an embodiment of the present invention;

FIG. 3 is a view concretely showing a reflecting unit according to an embodiment of the present invention;

FIG. 4 is a view showing light extraction efficiency depending on weather a diffusing unit is formed according to an embodiment of the present invention;

FIG. 5 is a view showing a region where the emotion lighting apparatus for vehicle is located according to an embodiment of the present invention;

FIG. 6 is a flowchart explaining a method for manufacturing an emotion lighting apparatus according to the present invention; and FIG. 7 shows a structure of OLED formed on a flexible fabric having excellent thermal stability, dimensional stability, and smoothness according to an embodiment of the present invention.

DETAILED DESCRIPTION

Exemplary embodiments are described in greater detail below with reference to the accompanying drawings.

While this invention has been described in connection with what is presently considered to be the practical and preferred embodiments, it is to be understood that the invention is not limited to the disclosed embodiment, but, on the contrary, is intended to cover various modifications and equivalent arrangements included within the scope of the invention.

The terms "first", "second", etc. may be used to describe diverse components, but the components are not limited by the terms. The terms are only used to distinguish one component from the others.

The terms used in this disclosure are only used to describe exemplary embodiments, but are not intended to limit the scope of the disclosure. The singular expression also includes the plural meaning as long as it does not differently mean in the context. In the present application, the terms "include" and "consist of" designate the presence of features, numbers, steps, operations, components, elements, or a combination thereof that are written in the specification, but do not exclude the presence or possibility of addition of one or more other features, numbers, steps, operations, components, elements, or a combination thereof.

Further, in the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

In the drawings, the thickness of layers and regions are exaggerated for clarity. It will be understood that when an element or layer is referred to as being "on" or "above" another element or layer, the element or layer may be directly on another element or layer or intervening elements or layers. Like numbers refer to like elements throughout the specification.

Hereinafter, an emotion lighting apparatus may be formed of various elements. The invention has been described using an exemplary necessary elements. However, it is to be understood that the scope of the invention is not limited.

The emotion lighting apparatus being a flexible large-area lighting of the present invention comprises a light guiding unit, a reflecting unit, a diffusing unit, and a refract guiding unit. The light guiding unit, the reflecting unit, and the diffusing unit are formed without additional adhesion in one entity. The diffusing unit has thin thickness. The refract guiding unit corrects thickness difference between the light guiding unit and reflecting unit, and light source. As a result, it is possible to apply high efficiency light source to the light guiding unit having thin thickness.

In addition, the emotion lighting apparatus of the present invention may be a lighting unit including a backlight unit, which comprises a liquid-crystal lighting unit formed in the most upper layer, a LED substrate having a plurality of LEDs, and an optical sheet formed of at least one prism sheet.

The emotion lighting apparatus according to the present invention is capable of indirectly lighting interior space of a vehicle by a lighting unit using OLED as a light source.

FIG. 1 is a view schematically showing an emotion lighting apparatus for vehicle according to an embodiment of the present invention.

The emotion lighting unit 1000 according to an embodiment of the present invention being a lighting apparatus indirectly lighting interior space of a vehicle comprises a lighting unit 101, a backlight unit 100, a light source 200, a supporting unit 300, and a cover 400.

The lighting unit according to the present invention can be embodied using at least one of OLED and LED as a light source.

The backlight unit 100 according to an embodiment of the present invention is capable of dispersing light input from the light source and reflecting or scattering a part of the dispersed light. Referring to FIGS. 2 and 3, the backlight unit 100 will be described in more detail.

The supporting unit 300 according to an embodiment of the present invention supports the backlight unit 100 and lighting unit 101. In this case, the supporting unit 300 safely installs and support the backlight unit 100 and the light source. In other words, the supporting unit 300 is classified into a whole supporting unit and a lateral supporting unit, and is combined with the cover 400 with covering the backlight unit 100 and the light source 200.

For example, the supporting unit 300 combines and fixes the supporting unit 300, the backlight unit 100, and the light source 200 through tapes or screws using grooves formed in at least a part of the backlight unit 100.

In addition, a trapping unit is protruded at the lateral supporting unit of the supporting unit 300 of the present invention is inserted and combined with another trapping unit, which is depressed to be formed in the cover 400. As another embodiment, if a trapping unit is depressed to be formed at the lateral supporting unit 300, a trapping unit formed in the cover may be protruded.

The cover 400 according to an embodiment of the present invention covers one surface of the backlight unit 100 and includes a transmitting window passing light input from the backlight unit 100.

The transmitting window makes light induced from the backlight unit 100 to be passed. As mentioned above, a trapping unit to be combined with the supporting unit 300 may be formed in the cover 300.

In addition, at least a part of the transmitting window according to an embodiment of the present invention may be formed of a mesh sheet.

The transmitting window formed with the mesh sheet is formed in a mesh-cell shape, and thereby easily controlling light transmittance and inducing high diffusing effect through change of cell structure.

Additionally, as not shown in Fig, the emotion lighting apparatus for vehicle 1000 according to an embodiment of the present invention further includes a cushioning member. For instance, the cushioning member is formed between the supporting unit 300 and the backlight unit 100, and the backlight unit 100 and the cover 400 to protect the backlight unit 100. In more detail, the cushioning member supports the backlight unit 100 and the light source 200 elastically. The cushioning member performs a function to minimize transmitting of impact created by external pressures.

The emotion lighting apparatus for vehicle 1000 according to an embodiment of the present invention 1000 can be modulized through the above-mentioned combination of components in one entity. In this emotion lighting apparatus for vehicle 1000, through an apparatus for supplying power such as a bulb socket of a housing installed in a vehicle, reference power is applied to the backlight unit 100 and the light source 200 to light interior of the vehicle as a surface lighting manner.

In addition, the emotion lighting apparatus for vehicle 1000 further includes a polarizing plate formed between the lighting unit 101 and the cover 400 classifying vertical polarizing or horizontal polarizing of light input from the light source to pass or prevent the light. In this case, the light source may be OLED. The OLED means a self-light emitting phenomenon by electrically combining electrons and holes injected from cathode and anode in organic materials. OLED is well known in the art and its construction is omitted hereinafter.

The lighting unit according to an embodiment of the present invention 101 comprises a substrate, a first electrode on the substrate, an organic layer on the first electrode, a second electrode on the organic layer, and a light transparent layer on at least one surface of the second electrode.

The substrate supports the first electrode, the second electrode, the organic layer, and transparent layer. The substrate is preferably formed of glass materials or plastic materials.

The light transparent layer is formed at least one from between the organic layer and the second electrode and from upper parts of the second electrode. For example, the light transparent layer may be formed on all of upper and lower surfaces of the second electrode or one of the upper and lower surfaces of the second electrode.

In this case, the light transparent layer performs a function to make the second electrode light transparency as well as high transmittance. The light transparent layer is formed of thin film to reduce sheet resistance of the second electrode, thereby preventing performance degradation of the lighting unit.

FIG. 2 is a is a view schematically showing a light source and a backlight unit according to an embodiment of the present invention.

The light source according to an embodiment of the present invention 200 is arranged around corners or lateral side of incoming light of the backlight unit 100. That is, the light source emits light towards the corners or lateral side of incoming light. The light source is at least one or more LEDs or LED chips. For example, the light source 200 is gallium nitride based LED. The number of light sources 200 have various values considering size of a display panel and brightness uniformity.

The backlight unit 100 according to an embodiment of the present invention comprises a refract guiding unit 110, a diffusing unit 120, a light guiding unit 130, and a reflecting unit 140.

In this case, each of the elements of the backlight unit 100 is not a stacked structure of different films but is formed in one entity.

In this case, it is preferable that the light source 200 has 1.0 T or more thickness for high efficiency. Only when the light guiding unit 130 with one or more 1.0 T thickness to apply this light source 200, light efficiency can be maximized. However, the light guiding unit 130 with one or more 1.0 T thickness has a limitation with respect to flexibility and disadvantageous of low design freedom due to bending radius of one or more 40 mm.

Accordingly, the light guiding unit having thin thickness as compared to the thickness of the light source for enhancing flexibility, and a slope is formed in the refract guiding unit 110 for correction thickness difference between the light guiding unit and light source. In more detail, at least one part of surface of the refract guiding unit 110 is formed in a slope-shaped, which is inclined at a predetermined angle with respect to horizontal plate.

The refract guiding unit 110 according to an embodiment of the present invention is formed of materials having excellent light transmittance and flexibility. The refract guiding unit 110 is formed of at least one selected from the group consisting of urethane, acryl, PC, PE, PI, PP, PS, PU, PET, PEN, and PAN, which is maintained in its shape and has flexibility after transformation by heating and pressing. For instance, the refract guiding unit 110 is separately processed by heating and pressing processes within preset frame, under the condition that the light source is arranged. Thus, existing process of the light guiding unit can be selected and applied.

The refract guiding unit 110 according to an embodiment of the present invention is formed between the light source and the light guiding unit 130. The refract guiding unit 110 concentrates total light input by refracting at least a part of light input from the light source and guides it to the light guiding unit 130.

In addition, to concentrate total light input from the light source, one surface the refract guiding unit 110 according to an embodiment of the present invention closing to the light guiding unit 130 is formed concavely toward inner direction thereof.

The refract guiding unit 110 of the present invention refracts at least a part of light input from the light source in a vertical direction using protrusions of at least a part of inner surfaces. As an example, upper protrusions makes light input to an upper part of the refract guiding unit 110 downward. One surface closing to the refract guiding unit 110 improves straight-ability of light through concave shape, thereby maximizing light input from the light guiding unit 130.

That is, the refract guiding unit 110 receives light emitted from the light source locate in one side thereof and concentrates light, thereby guiding it to the light guiding unit. At this time, a part of light emitted from the light source goes to the other side concaved to inner direction of the refract guiding unit 110. A part of light emitted from the light reaches a slope in one side of the refract guiding unit 110 and is refracted in a vertical direction with respect to the protrusions formed in the slope. As a result, the refracted light is refracted to the other side of the refract guiding unit 110 by the protrusions which are formed in lower inner sides of the refract guiding unit 110 to be guided to the light guiding unit 130.

In this case, one side of the refract guiding unit 130 formed concavely to an inner direction thereof makes straight-ability of light input from the light source enhance to concentrate it.

Referring to FIG. 2, the diffusing unit 120 is adjacent to an upper part of the light guiding unit 130 and capable of scattering light, which is diffused and escape from the light guiding unit 130.

As an example, the diffusing unit 120 further includes a low refractive-index diffusion coating layer using transparent polymer resin and low refractive-index inorganic particle to making light path irradiated from the light guiding unit 130 upward. The low refractive-index diffusion coating layer is capable of lowering refractive index of light input from the light guiding unit 130 and making refractive-index differences with the light guiding unit 130 large. As a result, the light path of light input from the light guiding unit 130 becomes upward to be concentrated and diffused.

As mentioned above, to maintain low refractive-index property of coating solution for forming the diffusing unit 120, low refractive-index inorganic particle is added to transparent polymer resin. More preferably, porous silica powder, hollow silica powder, or MgF2 particulate powder is mixed with UV-curable coating solution.

At this time, it is preferable that refractive ray index of light of transparent polymer resin is ranged from 1.4 to 1.5. Low refractive-index particles are mixed with porous silica powder having refractive index ranged from 1.1 to 1.4, hollow silica powder, or MgF2 to be coated, thereby lowering refractive index as well as scattering and diffusing light. Thus, the light path of light input from the light guiding unit 130 having refractive index ranged from 1.5 to 1.6 can be refracted upwardly.

In employing porous silica powder, hollow silica powder, or MgF2, particle size is preferably ranged from 0.01 μm to 0.05 μm. In case that materials having particle size ranged from 0.01 μm to 0.05 μm are used, refractive index of light is ranged from 1.3 to 1.38. Therefore, if the materials are mixed with transparent organic resin to be coated, it is possible to reduce refract index as well as create diffusion effect by refractive difference of porous silica powder, hollow silica powder, MgF2, and transparent UV-curable resin.

The diffusing unit 120 according to another embodiment of the present invention is formed to be mixed and coated with the above-mentioned powers as well as inorganic matter to particulate powder thereof, which lowers refractive index.

Transparent inorganic thin film coating layer according to an embodiment of the present invention is metal oxide, metal nitride, and metal fluoride. In more detail, various kinds of thin films such as SiO2(1.46), Al2O3(1.7), TiO2 (2.45), Ta2O5(2.2), ZrO2(2.05), HfO2(2.0), Nb2O5(2.33), Si3N4(2.02), MgF2(1.38) are coated through sputtering, E beam Evaporation, or PECVD. Also, the transparent inorganic thin film coating layer is coated in a single layer or a stacked layer.

The light guiding unit 130 scatters light input from the light source through patterns 131 formed therein.

To efficiently guide light input from the refractive guiding unit 110, the light guiding unit 130 prepares patterns 131 through stamping or printing depending on area. In this case, the thickness of the patterns 131 is preferably ranged from 3 μm to 10 μm. The patterns 131 through stamping is formed in intaglio, and the patterns 131 through printing is formed in relief.

The reflecting unit 140 according to an embodiment of the present invention is formed in a lower part of the light guiding unit 130 to reflect light going to outside among scattered from the light guiding unit 130.

FIG. 3 is a view concretely showing a reflecting unit according to an embodiment of the present invention.

Referring to FIG. 3, the reflecting unit 140 of the present invention further includes a primer layer 141, a catalyst layer 142, a silver layer 143, and a protective coating layer 144.

The primer layer 141 according to an embodiment of the present invention 141 is capable of enhancing interfacial adhesion with the catalyst layer 142. In this case, the primer layer 141 planarizes concave and convex substrate by the patterns formed by the light guiding unit 130 and maximizes interfacial adhesion with the reflecting unit 140.

In other words, the thickness of the primer layer 141 is preferably ranged from 0.1 μm to 10 μm. More preferably, the thickness of the primer layer 141 is thicker than that of the patterns of the light guiding unit 130. If the thickness of the primer layer 141 is thinner than that of patterns, curves of the patterns are not completely covered so that smoothness becomes reduced. Due to the reduced smoothness, a layer that will be stacked is not evenly coated, thereby reducing reflectivity.

In addition, the primer layer 141 is formed of UV-curable material or heat curable material. For enhancing reflectivity, it is preferable that the primer layer 141 is formed of UV-curable material. For enhancing adhesion, it is preferable that the primer layer 141 is formed of heat curable material.

The primer layer 141 according to another embodiment of the present invention further includes a wet reflecting layer through silver mirror reaction. The silver mirror reaction is a kind of plating reaction by precipitation through oxidation and reduction, and employs catalyst for quickly forming the catalyst layer at room temperature.

The catalyst layer 142 according to an embodiment of the present invention is formed using metallic salts. In more detail, the catalyst layer 142 catalyzes one surface of the primer layer 141 using aqueous catalyst solution formed of metallic salts or a mixture of at least two kinds of metallic salts. As a result, the velocity of silver mirror reaction is accelerated, and silver mirror reaction can be performed at low temperature.

In this case, various metallic salts such as Fe-based salts, Al-based salts, Zn-based salts and the like are used as catalyst. At this time, metallic salts are dissolved and sprayed to be coated. In case that wetting condition is poor, it is preferable that a small amount of surfactant is added in coating.

After that, the reflecting unit 140 further includes a silver layer 143 formed using silver injection and reduction liquid on one surface of the catalyst layer 142. In this case, the silver injection is formed by containing salts having the same silver ion as silver nitrate and an amount of aqueous ammonia. That is, the reduction liquid in the present invention is capable of deoxidizing silver using formaldehyde, acetaldehyde, sodium (Na+), potassium (K+), organic bases, and amine-based compounds as main component. At this time, it should be understood that the reduction liquids capable of deoxidizing silver are applicable and not limited to the above-mentioned compounds. For example, NaOH, KOH, and reducing sugar are applicable. The deposition and purity of silver depend on concentration and variety.

The present invention is advantageous of gloss, high reflectivity, and elegant appearance. Overcoming disadvantages such that silver becomes easily discolored in contact with various kinds of active gases in air, surfaces are treated using inorganic-based (silica base and the thickness thereof is 5 μm) coating solutions having enough sealing in a coating thickness, thereby preventing the reflecting unit 140 exposed outside for a long time from be discolored.

The reflectivity of the above-mentioned reflecting unit 140 is 95% and more finally in full-wavelength region.

The backlight unit 100 and the light source and the backlight unit are bar-shaped LED.

FIG. 4 is a view showing light extraction efficiency depending on weather a diffusing unit is formed according to an embodiment of the present invention.

As shown in FIG. 4, the emotion lighting apparatus according to the present invention may be flexible.

FIG. 5 is a view showing a region where the emotion lighting apparatus for vehicle is located according to an embodiment of the present invention.

As shown in FIG. 5, a surface lighting unit and the lighting unit 101 of the emotion lighting apparatus for vehicle according to an embodiment of the present invention are located at the ceiling of the vehicle for indirectly lighting interior thereof and creating atmosphere in the vehicle as an emotional and mood lighting.

In the present invention, as shown in FIG. 5, the emotion lighting apparatus for vehicle 1000 is described as a sun visor of a vehicle roof but is not limited to the disclosed embodiment. In other words, the emotion lighting apparatus 1000 is applicable in headliners, sun-roof screens, IP lighting units, foot wells in vehicles, center consoles, glove boxes, door units and the like.

FIG. 6 is a flowchart explaining a method for manufacturing an emotion lighting apparatus according to the present invention.

According to the method for the emotion lighting apparatus according to the present invention 1000, a supporting unit 300 is formed in advance (S10).

The supporting unit 300 supports the backlight unit 100. In this case, the supporting unit 300 safely installs and support the backlight unit 100 and the light source. In other words, the supporting unit 300 is classified into a whole supporting unit and a lateral supporting unit, and is combined with the cover 400 with covering the backlight unit 100 and the light source 200.

Next, a light guiding unit 130 for dispersing light input from light source through patterns formed in the light guiding unit is formed (S20).

Then, a primer layer 141 planarizing concave and convex substrate by the patterns formed by the light guiding unit 130 and maximizes interfacial adhesion with a reflecting unit 140 is formed (S30).

After forming the primer layer, the reflecting unit 140 formed at a lower part of the light guiding unit 130 to reflect light being out among dispersed light of the light guiding unit 130 is formed (S40).

In this case, the reflecting unit 140 according to an embodiment of the present invention can be formed separately and with the primer layer. Each of the above-mentioned structure is not separately stacked but is formed in one entity in which role and function thereof are separated.

Next, a diffusing unit 140 adjoining an upper part of the light guiding unit 130 and scattering light dispersed from the light guiding unit 130 is formed (S50).

After the diffusing unit 140, a refract guiding unit 110 formed between the light source and the light guiding unit 130 and concentrating total light input by refracting at least a part of light input from the light source to guide the light to the light guiding unit 130 (S60).

As mentioned above, if the supporting unit 300 is formed, and the backlight unit 100 including the light guiding unit, the primer layer, the reflecting unit, the diffusing unit and refract guiding unit is formed on the supporting unit 300, the cover 400 is formed finally (S70).

The cover 400 according to an embodiment of the present invention covers one surface of the backlight unit and may include a transmitting window passing light input from the backlight unit.

According to the method for the emotion lighting apparatus according to the present invention 1000, a lighting unit using at least one of OLED and LED as a light source is formed, and a supporting unit for supporting the light source is formed. Next, a cover for covering the lighting unit and including a transmitting window passing light from the light source is formed. In this case, the light unit and cover are bendable.

Next, a polarizing plate formed between the lighting unit and the cover and classifying vertical polarizing or horizontal polarizing of light input from the light source to pass or prevent the light.

Then, a method for manufacturing the lighting unit will be described hereinafter.

In forming a lighting unit using OLED as a light source, a substrate is formed. A first electrode is formed on the substrate. Next, an organic layer is formed on the first electrode.

After the organic layer is formed, a second electrode is formed in the organic layer and a light transmitting layer is formed on at least one surface of the second electrode, thereby forming a lighting unit.

FIG. 7 shows a structure of OLED formed on a flexible fabric having excellent thermal stability, dimensional stability, and smoothness according to an embodiment of the present invention.

In FIG. 7, fabrics used as a fabric substrate is preferably formed of synthetic resins. A first planarization layer is preferably formed of one of silane, polyurethane, and polycarbonate or a mixture two or more thereof. A second planarization layer is preferably formed of one of acrylate-based polymer epoxy-based polymer, amine-based polymer and vinyl-based polymer or a mixture two or more thereof.

The second planarization layer may further includes a light-absorbing agent. The light-absorbing agent performs a photo curable function through free radical process initiated by light-degradable path and a specific mixing ratio can be varied depending on final characteristic.

A planarization fabric substrate for a flexible display having excellent thermal stability, dimensional stability, and smoothness is suitable for electrons, electronic elements including electrons and an optical assembly structure, and preferably display devices (including wearable display), photovoltaic cells, and semiconductor devices.

According to the emotion lighting apparatus for vehicle and the method for manufacturing the same, flexible surface lighting apparatus can be embodied.

Furthermore, the emotion lighting apparatus for vehicle using the backlight unit is capable of securing productivity by wet coating performed on surfaces of the light guiding unit without additional adhesion layers and preventing glaring by emitting constant light amount from a different angle.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. An emotion lighting apparatus for a vehicle, the apparatus comprising:
   a lighting unit using a light-emitting diode (LED) as a light source, the light unit including a backlight unit for dispersing light input from the light source and reflecting and scattering at least a part of the dispersed light;
   a supporting unit for supporting the light source; and
   a cover for covering the lighting unit and including a transmitting window passing light from the light source,
   wherein the lighting unit and the cover are bendable, and
   wherein the backlight unit comprises:
      a first light guiding unit for dispersing the light input from the light source through patterns formed in intaglio or relief in the first light guiding unit;
      a second light guiding unit disposed between the light source and the first light guiding unit and concentrating total light input from the light source by reflecting at least a part of the total light input from the light source to guide the total light including the at least a part of the total light to the first light guiding unit; and
      a diffusing unit disposed on an upper part of the first light guiding unit and scattering light dispersed from the first light guiding unit,
   wherein the second light guiding unit comprises:
      a first portion having a sloped surface to reflect the at least a part of the light horizontally input from the light source in a vertical direction;
      a second portion having a surface that is concave in a direction toward the light source, the concave surface being disposed adjacent to the first light guiding unit, the total light input from the light source being guided to the first light guiding unit through the second portion;
      a third portion including a surface that is formed adjacent to the diffusing unit and formed between the first portion and the second portion; and
      a fourth portion including a surface that is formed adjacent to a reflecting unit and formed under the second portion, and
   wherein the diffusing unit comprises a low refractive-index diffusion coating layer including transparent polymer resin and silica powder.

2. The emotion lighting apparatus for the vehicle according to claim 1, wherein at least one surface of the second light guiding unit has a slope at a predetermined angle with respect to a horizontal plane, and
   wherein the second light guiding unit refracts the at least a part of the light horizontally input from the light source in the vertical direction using the at least one surface having the slope at the predetermined angle.

3. The emotion lighting apparatus for the vehicle according to claim 1, wherein the backlight unit further comprises:
   the reflecting unit disposed under a lower part of the first light guiding unit and reflecting light dispersed from the first light guiding unit.

4. The emotion lighting apparatus for the vehicle according to claim 3, wherein the reflecting unit comprises:
   a catalyst layer formed using metallic salts;
   a silver layer formed using silver injection and reduction liquid on one side of the catalyst layer; and a primer layer for enhancing interfacial adhesion with the catalyst layer.

5. The emotion lighting apparatus for the vehicle according to claim 1, wherein at least a part of the transmitting window is formed of a mesh sheet.

6. The emotion lighting apparatus for the vehicle according to claim 1,
wherein the light source and the backlight unit are bar-shaped individually.

7. A method for manufacturing an emotion lighting apparatus for a vehicle comprises:
forming a lighting unit using a light-emitting diode (LED) as a light source, the lighting unit including a backlight unit for dispersing light input from the light source and reflecting and scattering at least a part of the dispersed light;
forming a supporting unit for supporting the light source; and
forming a cover for covering the light unit, the cover including a transmitting window passing light from the light source,
wherein the light unit and the cover are bendable, and
wherein forming the backlight unit comprises;
forming a first light guiding unit including patterns formed in intaglio or relief in the first light guiding unit, the first light guiding unit for dispersing the light input from the light source through the patterns;
forming a second light guiding unit between the light source and the first light guiding unit, the second light guiding unit concentrating total light input from the light source by reflecting at least a part of the total light input from the light source to guide the total light including the at least a part of the total light to the first light guiding unit; and
forming a diffusing unit on an upper part of the first light guiding unit, the diffusing unit scattering light dispersed from the first light guiding unit,
wherein the second light guiding unit comprises:
a first portion having a sloped surface to reflect the at least a part of the light horizontally input from the light source in a vertical direction;
a second portion having a surface that is concave in a direction toward the light source, the concave surface being disposed adjacent to the first light guiding unit the total light input from the light source being guided to the first light guiding unit through the second portion;
a third portion including a surface that is formed adjacent to the diffusing unit and formed between the first portion and the second portion; and
a fourth portion including a surface that is formed adjacent to a reflecting unit and formed under the second portion, and
wherein forming the diffusing unit comprises forming a low refractive-index diffusion coating layer that includes transparent polymer resin and silica powder.

8. The method according to claim 7, wherein at least one surface of the second light guiding unit has a slope at a predetermined angle with respect to a horizontal plane, and
wherein the second light guiding unit refracts the at least a part of the light horizontally input from the light source in the vertical direction using the at least one surface having the slope at the predetermined angle.

9. The method according to claim 7, wherein forming the backlight unit further comprises:
forming the reflecting unit under a lower part of the first light guiding unit, the reflecting unit reflecting light dispersed from the first light guiding unit.

10. The method according to claim 9, wherein forming the reflecting unit comprises:
forming a catalyst layer using metallic salts;
forming a silver layer using silver injection and reduction liquid on a first side of the catalyst layer; and
forming a primer layer for enhancing interfacial adhesion with the catalyst layer on a second side of the catalyst layer.

11. The method according to claim 7, wherein at least a part of the transmitting window is formed of a mesh sheet.

12. The method according to claim 7,
wherein the light source and the backlight unit are bar-shaped individually.

* * * * *